United States Patent [19]

Lo et al.

[11] 4,410,963
[45] Oct. 18, 1983

[54] CROSS-TIE PROPAGATION USING OFFSET SERRATION AND CROSS-TIE ROCKING ACTION

[75] Inventors: David S. Lo, Burnsville; Maynard C. Paul, Bloomington; Lawrence G. Zierhut, Eagan, all of Minn.

[73] Assignee: Sperry Corporation, New York, N.Y.

[21] Appl. No.: 308,296

[22] Filed: Oct. 5, 1981

[51] Int. Cl.³ .............................................. G11C 19/08
[52] U.S. Cl. ....................................... 365/87; 365/172
[58] Field of Search ........................... 365/87, 171, 172

[56] References Cited

U.S. PATENT DOCUMENTS

| | | | |
|---|---|---|---|
| 4,075,612 | 2/1978 | Johnson et al. | 365/171 |
| 4,192,012 | 3/1980 | Schwee et al. | 365/87 |
| 4,253,161 | 2/1981 | Paul et al. | 365/87 |

Primary Examiner—James W. Moffitt
Attorney, Agent, or Firm—Kenneth T. Grace; Marshall M. Truex

[57] ABSTRACT

An improved magnetic memory system in which binary data are stored as cross-tie, Bloch-line pairs, which are serially propagated downstream along a cross-tie wall and a magnetizable layer by appropriate drive fields. The magnetizable layer is configured into a data track whose two mirror-image, opposing edges are formed into patterns of asymmetrically shaped edges which form successive narrow portions, or necks, with wide portions therebetween, and which shaped edges are formed about the geometric central line of the data track. The cross-ties are structured in the data track by opposite-edge necks at which the ends of the cross-tie are magnetically stable. The improvement comprises:

forming a serpentine energy well along and about the geometric centerline of the data track, which energy well has the same period as the shaped edges;
displacing the necks of the opposing edges one half the distance between adjacent necks along each edge; and,
propagating the cross-tie, Bloch-line pairs along the data track by rocking alternate ends of the cross-tie from its associated neck to the next adjacent downstream neck.

3 Claims, 6 Drawing Figures

CROSS-TIE PROPAGATION USING OFFSET SERRATION AND CROSS-TIE ROCKING ACTION

BACKGROUND OF THE INVENTION

The propagation of inverted Néel wall sections in a serial accessed memory system was first proposed by L. J. Schwee in the publication "Proposal On Cross-Tie Wall and Bloch-Line Propagation in Thin Magnetic Films", IEEE Transactions on Magnetics, MAG 8, No. 3, pages 405-407, September 1972. Such memory systems utilizes a ferromagnetic film strip of approximately 81% Ni-19% Fe approximately 350 Angstroms (Å) thick in which cross-tie walls can be changed to Néel walls and Néel walls can be changed to cross-tie walls by applying appropriate drive fields thereto. Associated with a cross-tie wall is a section of an inverted Néel wall that is bounded by a cross-tie on one end and a Bloch-line on the other end.

In such a cross-tie wall memory system, information is entered at one end of the serial access memory system by the generation of an inverted Néel wall section, formed by a cross-tie on one end and a Bloch-line on the other, that is representative of a stored binary 1 or of a non-inverted Néel wall section (i.e., the absence of a cross-tie, Bloch-line pair) that is representative of a stored binary 0. Such information is moved or propagated along the cross-tie wall by the successive generation (and then the selective annihilation) of inverted Néel wall sections at successive memory cells along the cross-tie wall. In the D. S. Lo, et al, U.S. Pat. No. 3,906,466 there is disclosed a propagation circuit for the transfer of inverted Néel wall sections through successive memory cells along a cross-tie wall. In the L. J. Schwee, et al, AIP Conference Proceedings, No. 29, 21st Annual Conference on Magnetism and Magnetic Materials, 1975 published April, 1976, pages 624-625 and in the publication "Geometry of Serrated Magnetic Film Strips for the Cross-Tie Memory" D. S. Lo, et al, IEEE Transactions on Magnetics, January 1977, pages 936-938, there have been published some recent results of the further development of cross-tie wall memory systems.

In a cross-tie wall memory system, the selective generation and propagation of the digital-data-representing inverted Néel wall sections and the associated cross-tie, Bloch-line pairs have been demonstrated in the laboratory. Additionally, it has been shown that the data track of a cross-tie wall memory system may be configured into a film strip having repetitive patterns of asymmetrically serrated edge contours. Such film strip configurations are disclosed in the L. H. Johnson, et al, U.S. Pat. No. 4,075,612 the L. J. Schwee, et al, U.S. Pat. No. 4,100,609, the L. J. Schwee, et al, U.S. Pat. No. 4,192,012, and in the publication "Cross-Tie Memories Simplified by the Use of Serrated Strips", L. J. Schwee, et al, AIP Conference Proceedings, No. 29, 21st Annual Conference on Magnetism and Magnetic Materials, 1975, published April, 1976, pages 624-625.

More recently, it has been proposed to construct cross-tie wall memory systems from a plurality of data tracks, each of which is formed as a strip of isotropic magnetic film, i.e., a film having substantially zero uniaxial anisotropy. The data-track-defining strip of isotropic magnetic film utilizes its shape, i.e., its edge contour, induced anisotropy, rather than its easy access magnetic field induced anisotropy, to constrain the cross-tie wall within the planar contour of the film strip. The use of the shape induced anisotropy of an isotropic strip of magnetic film permits the use of nonlinear, i.e., curved, data tracks that may be configured into cross-tie wall memory systems that perform both memory and logic functions. Such a system is disclosed in the E. J. Torok U.S. Pat. No. 4,075,613.

Although the generation, propagation and logic manipulation of the inverted Néel wall section-defining-data-bits and the detection and readout thereof have been receiving considerable study, one area that can still use improvement in the development of a cross-tie wall memory system is the data track or the device that stores and structures the information, i.e., the cross-tie, Bloch-line pairs, in the cross-tie wall memory system. In the copending patent application of G. J. Cosimini, et al, Ser. No. 218,993 filed Dec. 22, 1980, there is disclosed such an improved data track. This improvement consists of the addition of areas of decreased data track thickness along the geometric centerline of the data track for forming energy wells that provide an increased cross-tie, Bloch-line pair resistance to deleterious movement away from the geometric centerline of the data track and/or along the cross-tie wall. Energy wells, for storing the cross-ties, are formed between apposing necks, or across the narrow portions of the data track and transverse the data track centerline, for producing magnetostatically favorable positions for the cross-tie thereat. These energy wells provide an increased resistance to the creep or movement of the cross-tie wall, and the associated cross-tie, Bloch-line pairs, when subjected to repetitive memory drive field cycling during memory operation. The present invention is directed toward an improved method and an apparatus for storing and structuring the information in a cross-tie wall memory system.

SUMMARY OF THE INVENTION

In the present invention, the serrated data track of the L. J. Schwee, et al, AIP publication and the energy well of the G. J. Cosimini, et al, patent application are combined and modified to provide a data track of improved operating characteristics. In the present invention, the mirror-imaged serrated edges of the data track of L. J. Schwee, et al, are displaced along the longitudinal axis, or geometric centerline, of the data track whereby the necks or narrow portions of the data track are displaced one half the distance between the necks on the apposing edges of the data track while the energy well is caused to follow a serpentine path along and about the longitudinal axis of the data track. For propagation of the information stored in the data track, the cross-tie, Bloch-line pairs are subjected to a transverse drive field that is directioned transverse to the longitudinal axis of the data track. The alternate longitudinal drive fields cause the cross-ties to "rock" from and across the displaced necks of the apposing data track's serrated edges. The serpentine energy well structures the cross-tie center therein causing it to follow the serpentine-path-forming energy well. The combination of the serpentine energy well and the rocking of the cross-tie, forces the cross-tie center to move in a path that is not equal distance between displaced necks between which the cross-tie is structured along the data track. This unequal displacement of the cross-tie center causes the portions of the cross-tie that are on opposite sides of the cross-tie center to be unequally affected by the longitudinal drive fields for generating the rocking action of the propagation of the cross-tie, Bloch-line pairs along the data track.

DESCRIPTION OF THE PREFERRED EMBODIMENT

Figure 1:
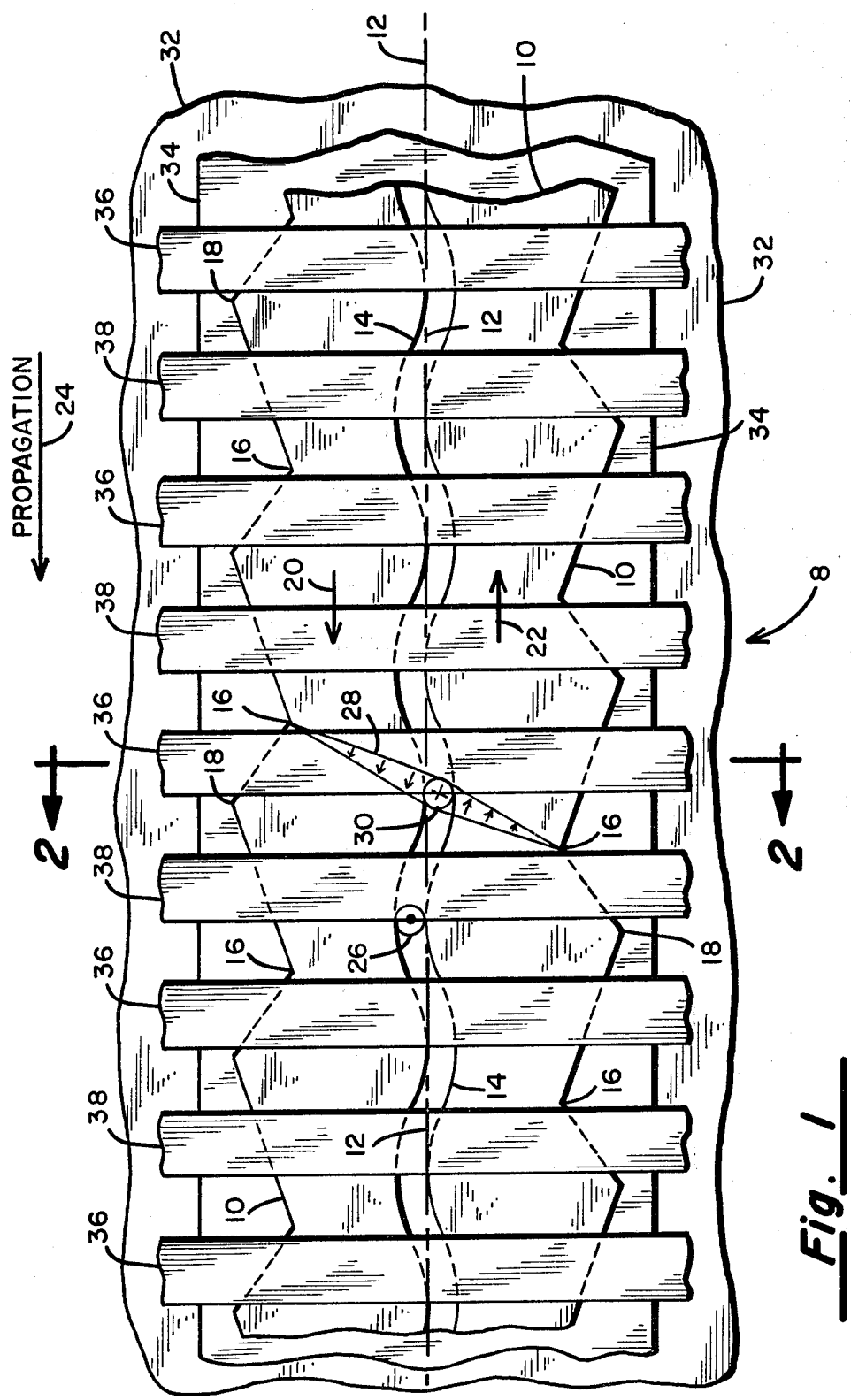
FIG. 1 is a schematic illustration of a portion of a cross-tie wall memory system illustrating, in detail, the data track of the present invention.

With particular reference to FIG. 1, there is presented an illustration of a memory plane 8 that includes magnetizable data track 10, which is a modified version of a combination of the teaching of the hereinabove referenced G. J. Cosimini, et al, patent application and the L. J. Schwee, et al, AIP publication. Data track 10 is formed of a 350 Å thick layer of approximately 81% Ni-19% Fe that is configured into a strip whose two apposing edges are formed into mirror-imaged, uniformly spaced, repetitive patterns of asymmetrically shaped edges. These repetitive edge patterns are formed of successive narrow portions, or necks, 16, forming wide portions 18 therebetween, which edge patterns are formed about the geometric centerline 12 of the strip. The apposing edge patterns are displaced one half the distance between adjacent narrow portions, or necks, 16 on like edges of the data track 10. Additionally, the data track 10 has formed therein a serpentine energy well 14 that follows, in an undulating manner, along and about the geometric centerline 12 of data track 10. The serpentine path of energy well 14 has the same periodicity as the repetitive edge patterns of data track 10 while moving along and about centerline 12.

Figure 2:
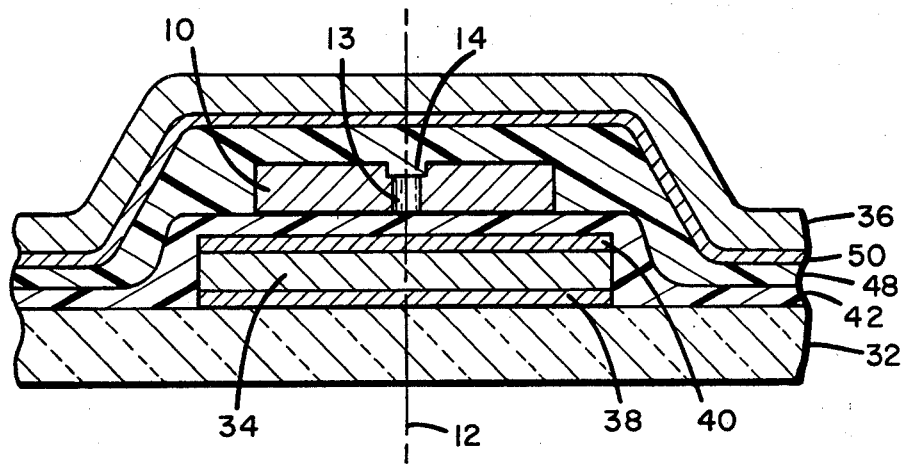
FIG. 2 is an illustration of a cross-section of the memory plane of FIG. 1 taken along line 2—2 thereof illustrating the stacked, superposed elements of FIG. 1.

As is well-known, such data track 10, when affected by the proper drive fields, normally—without the serpentine energy–establishes a cross-tie wall 13—see FIG. 2—along its geometric centerline 12. Preferably, the film strip forming data track 10 is isotropic, i.e., has substantially zero magnetic field induced anisotropy, and utilizes its shape, i.e., its edge contour, to constrain the cross-tie wall within the planar contour of and normally along the geometric centerline, or longitudinal axis, 12 of data track 10. Upon the collapse of the drive fields that establish the cross-tie wall 13 along the geometric line 12, the magnetization in data track 10 is established in two anti-parallel directions about the cross-tie wall 13 as denoted by arrows 20 and 22. This mechanism for the establishment of the anti-parallel magnetic domains above and below the cross-tie wall 13 is more fully discussed in the L. H. Johnson, et al, U.S. Pat. No. 4,075,612. However, because of the serpentine energy well 14 that is utilized by the present invention, the cross-tie wall 13 is constrained to follow the serpentine path of energy well 14 and not centerline 12. Further, the cross-tie center 30 of cross-tie 28 is also constrained to follow the serpentine path of energy well 14, and correspondingly the cross-tie wall 13, moving along and about centerline 12. This undulating movement of cross-tie center 30 about and along centerline 12 forces cross-tie 28 to undergo changes in its geometric contour, or shape, and correspondingly, its magnetic properties. This change in the magnetic properties of cross-tie 28 is essential to its propagation along data track 10 when subjected to the drive fields of FIG. 4.

In the prior art, as in the hereinabove referenced L. J. Schwee, et al, AIP publication, data track 10 is configured into a strip whose two apposing edges are mirror-image, uniformly spaced, repetitive patterns of asymmetrically shaped edges which repetitive patterns are formed of successive narrow portions 16 forming wide portions 18 therebetween. These apposing narrow portions 16 provide areas across data track 10 at which the cross-ties 28 are more energetically stable than at any other position, such as across apposing wide portions 18 between the adjacent, along the same edge, narrow portions 16 within data track 10. The apposing wide portions 18 between adjacent narrow portions 16 provide areas across data track 10 at which the Bloch-lines 26 are more energetically stable, than as at the apposing narrow portions 16, than at any other area within data track 10. Thus, the geometric conformation of the apposing edges of data track 10 establishing areas at which the cross-tie, Bloch-line pairs are more energetically stable than any other position within data track 10. However, it has been determined that successive applications of drive fields to data track 10 cause the cross-tie wall and the associated cross-tie 28, Bloch-line 26 pairs therealong to move away from their initially most energetically stable states.

It has been determined that if the cross-tie 28 can be more strongly coupled to the apposing narrow portions 16, the cross-tie 28 will be less likely to be adversely affected by externally applied drive fields. This strong coupling of the cross-tie 28 to the narrow portion 16 is accomplished in the present invention by forcing the cross-tie center 30 to move closer to one of the two apposing narrow portions 16 across which the cross-tie 28 is structured by the so-formed more energetically stable state. This also provides a corresponding weaker coupling to the other apposing narrow portion 16; however, the net result is a substantially stronger coupling of the cross-tie 28 to the two apposing narrow portions 16 across which it is structured. The energy well 14 provides, in effect, an in-plane field that changes in an up-down-up relationship along centerline 12, the magnitude of which in-plane field is a function of the distance the energy well deviates from the centerline 12; the greater the deviation, the greater effective in-plane field acting upon the cross-tie center 30. Accordingly, this bipolar in-plane field provided by the serpentine energy wall 14 may be provided by an externally applied bipolar in-plane drive field; however, it is believed that the use of the combination of the serpentine energy well and an externally applied bipolar in-plane drive field provides a cross-tie wall memory system with the optimum operating margins.

Figure 4:
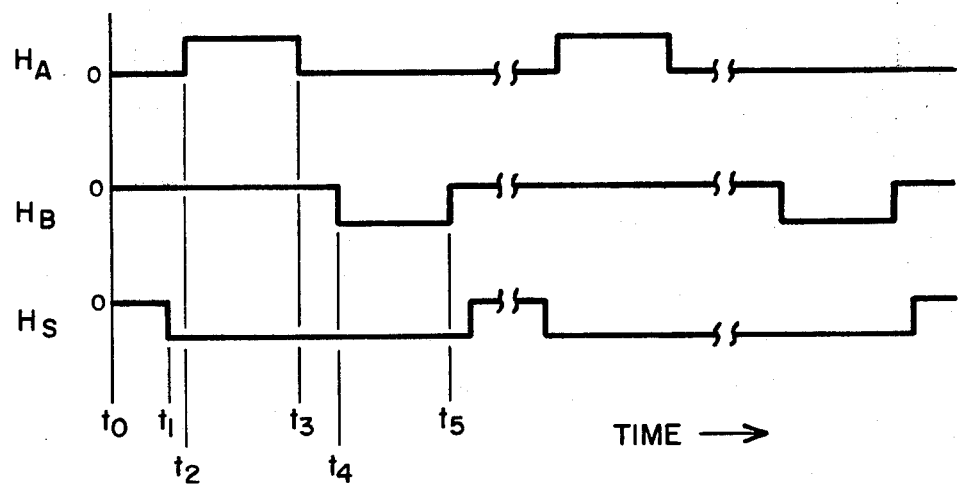
FIG. 4 is an illustration of an illustrative timing diagram for the operation of the cross-tie wall memory system of FIG. 1.

In the present invention, as illustrated in FIG. 1, the memory plane 8 includes the following stacked, superposed elements: a glass substrate 32; a stripline 34 for coupling a transverse drive $H_S$ to data track 10; data track 10; and, the alternate, parallelly aligned, orthogonal to centerline 12, longitudinal strip lines 36 and 38 for coupling the alternate, opposite polarity, in-plane, longitudinal drive fields $H_A$ and $H_B$, respectively, to data track 10 and having a relative timing and polarity as illustrated in FIG. 4. Additionally, although data track 10 is illustrated in FIG. 1 as a layer of magnetizable material having physically terminating edge patterns, it is to be understood that a plurality of data tracks 10 could be parallelly formed in a single continous layer of magnetizable material in which the edge patterns, for each of the data tracks, could be determined by energy forming wells that are formed by any of various well-known methods, such as chemical etching or ion bombardment.

With particular reference to FIG. 2, there is presented a cross-sectional view of FIG. 1 taken along line 2—2. FIG. 2 illustrates that this stack, superposed relationship includes the following listed successive layers:

glass substrate 32—0.50 mm thick
chromium adhesive layer 38—100 Å thick
gold stripline 34—1500 Å thick
chromium adhesive layer 40—100 Å thick
SiO insulative layer 42—12,500 Å thick
Permalloy data track 10—approximately 81% Ni-19% Fe, 350 Å thick
SiO insulative layer 48—12,500 Å thick
chromium adhesive layer 50—100 Å thick
gold stripline 36—1,000 Å thick.

Figure 3A:
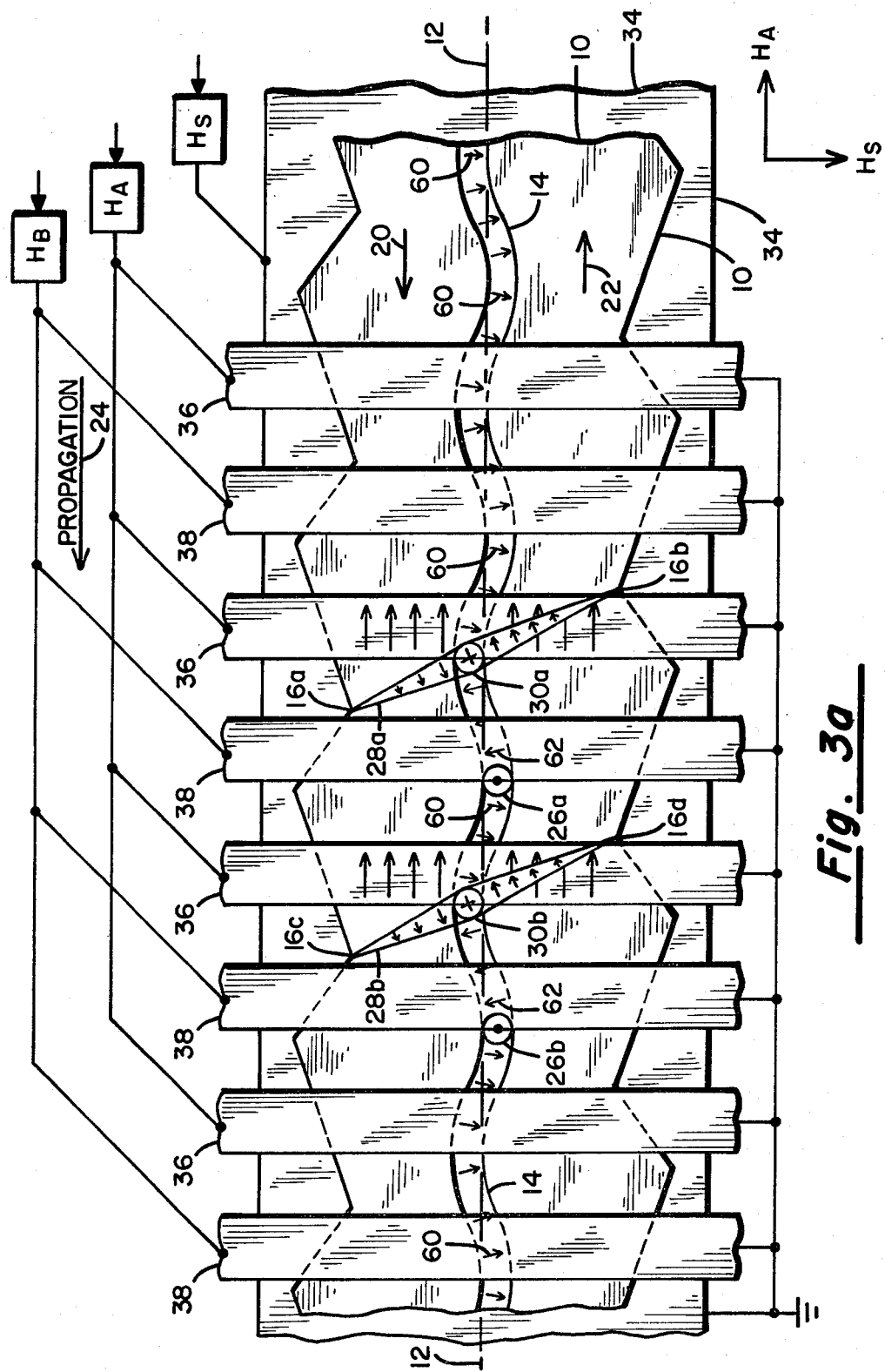
FIGS. 3a and 3b are illustrations of the structuring of the cross-tie, Bloch-line pairs when subjected to the alternate, equal intensity, but oppositely directioned longitudinal drive fields.
Figure 3B:
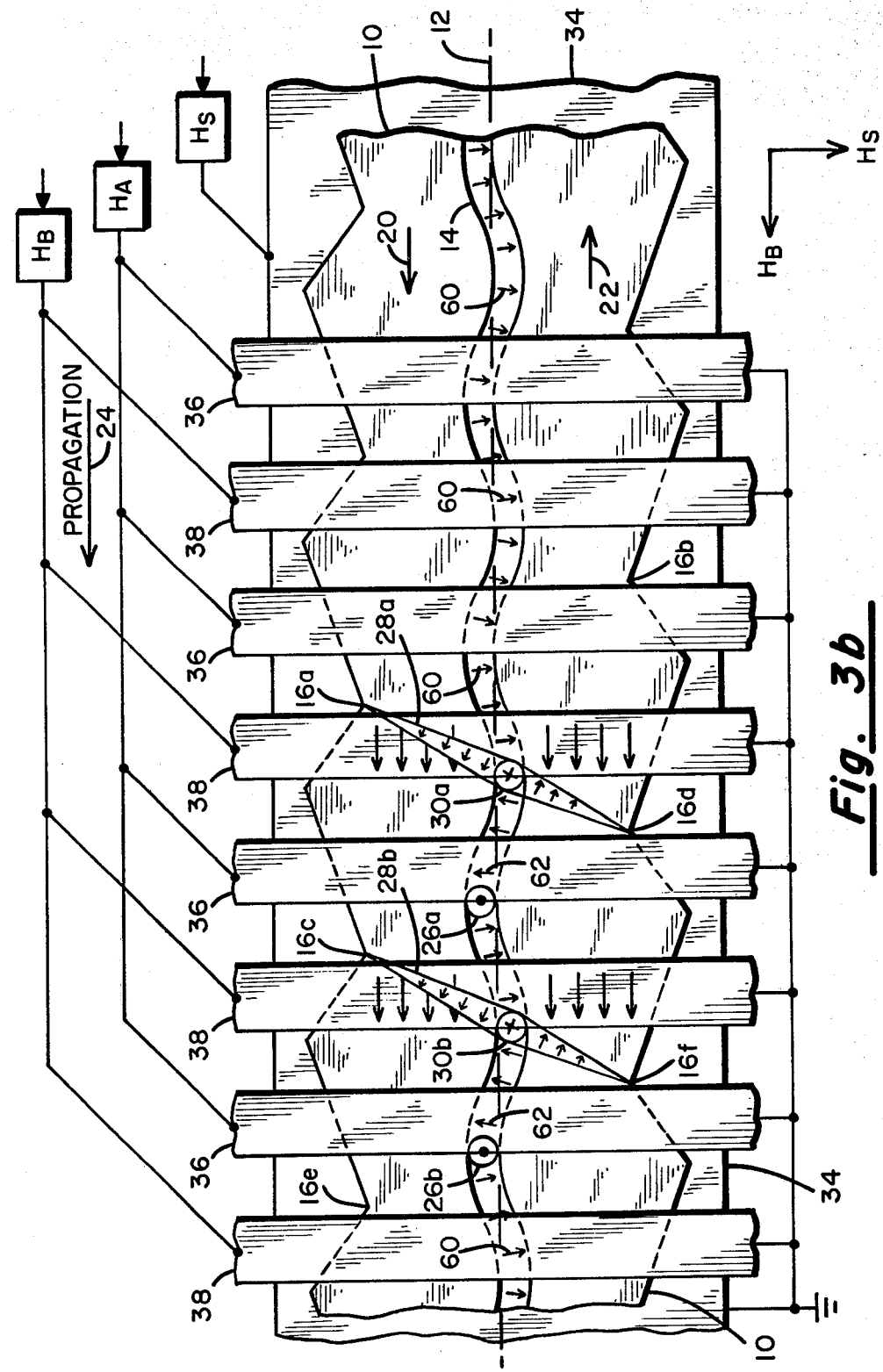

With particular reference to FIGS. 3a and 3b there are presented illustrations of the structuring of the cross-tie, Bloch-line pairs as they propagate along data track 10 when subjected to the drive fields of FIG. 4. Initially, as at time $t_o$, the cross-ties 28a and 28b are magnetostatically coupled at their upper and lower ends to apposing necks 16a, 16b and 16c and 16d, respectively, across data track 10 as illustrated in FIG. 3a. This, for purposes of identification, may be described as their stored state. Note that because in the present invention there is no nucleate-annihilate sequence in a store-transfer propagation of the cross-tie Bloch-line pairs, (see the M. C. Paul, et al, U.S. Pat. No. 4,253,160) successive data representing cross-tie, Bloch-line pairs may be stored in successive store sections of the data track, i.e., across successive, apposing edge pairs of necks. This doubles the memory capacity of the cross-tie wall memory system for the same size data track.

Next, as at time $t_1$, pulse source $H_S$ couples a current signal to stripline 34 tending to cause the cross-tie 28 that lay thereover to be pushed to the left or downstream. This left-wise, or downstream, movement is generated by the downwardly directed field $H_S$ acting additively upon the downwardly directed field in the Néel wall section of the cross-tie wall, represented by the vectors 60, and acting subtractively upon the upwardly directed field, in the inverted Néel wall section of the cross-tie wall in the cross-tie wall, represented by vectors 62.

Next, as at time $t_2$, pulse source $H_A$ couples a current signal to stripline 36 causing the cross-ties 28 that lay thereunder to be rocked to the left or downstream. The field $H_A$ in the plane of data track 10 is in a rightward or upstream direction being additive to the field represented by vector 22 and subtractive from the field represented by vector 20. This combination of magnetic fields tends to cause the cross-tie centers 30 to be moved upwardly causing the upward end of the cross-ties 28 to be more intensely or strongly coupled to the upward neck 16 than to the downward neck 16. Accordingly, the combination of the orthogonal fields $H_S$ and $H_A$ causes the cross-ties 28, e.g., cross-tie 28a, to rock in a downstream direction about their upward ends, e.g., as at neck 16a, with their downward ends rotating or switching from the upstream neck, e.g., neck 16b, as at a time prior to time $t_1$, and to the next adjacent downstream neck, e.g., neck 16d, as at a time subsequent to time $t_2$. Accordingly, at a time subsequent to time $t_2$, the cross-tie, Bloch-line pairs are now in a transfer state as illustrated in FIG. 3b.

Next, as at time $t_3$, pulse source $H_A$ terminates its current signal coupled to striplines 36 and then at time $t_4$, pulse source $H_B$ couples a current signal to striplines 38 causing the cross-ties 28 that lay thereunder to be rocked to the left or downstream. The field $H_B$ in the plane of data track 10 is in a leftward or downstream direction being additive to the field represented by vector 20 and subtractive from the field represented by vector 22. This tends to cause the cross-tie centers 30 to be moved downwardly causing the downward end of the cross-ties 28 to be more intensely or strongly coupled to the downward neck 16 then to the upward neck 16. Accordingly, the combination of the orthogonal fields $H_S$ and $H_B$ causes the cross-ties 28 e.g., cross-tie 28a, to rock in a downstream direction about their downward ends, e.g., as at neck 16d with their upward ends rotating or switching from the upstream neck, e.g., neck 16a, as at a time prior to the time $t_4$, to the next adjacent downstream neck, e.g., neck 16c, as at a time subsequent to time $t_4$. Accordingly, at a time subsequent to time $t_4$ the cross-tie, Bloch-line pairs are now in a stored state such as that illustrated in FIG. 3a with cross-tie 28a now being in the position previously occupied by cross-tie 28b.

In the first, or lefthand, portion of FIG. 4, field $H_S$ is illustrated as being a pulse drive field; however, for normal operation of a cross-tie wall memory system in which successive transfer-store sequences are performed, field $H_S$ may be continuous over the duration of successive sequences of fields $H_A$, $H_B$, as is illustrated in the second or righthand portion of FIG. 4.

Figure 5:
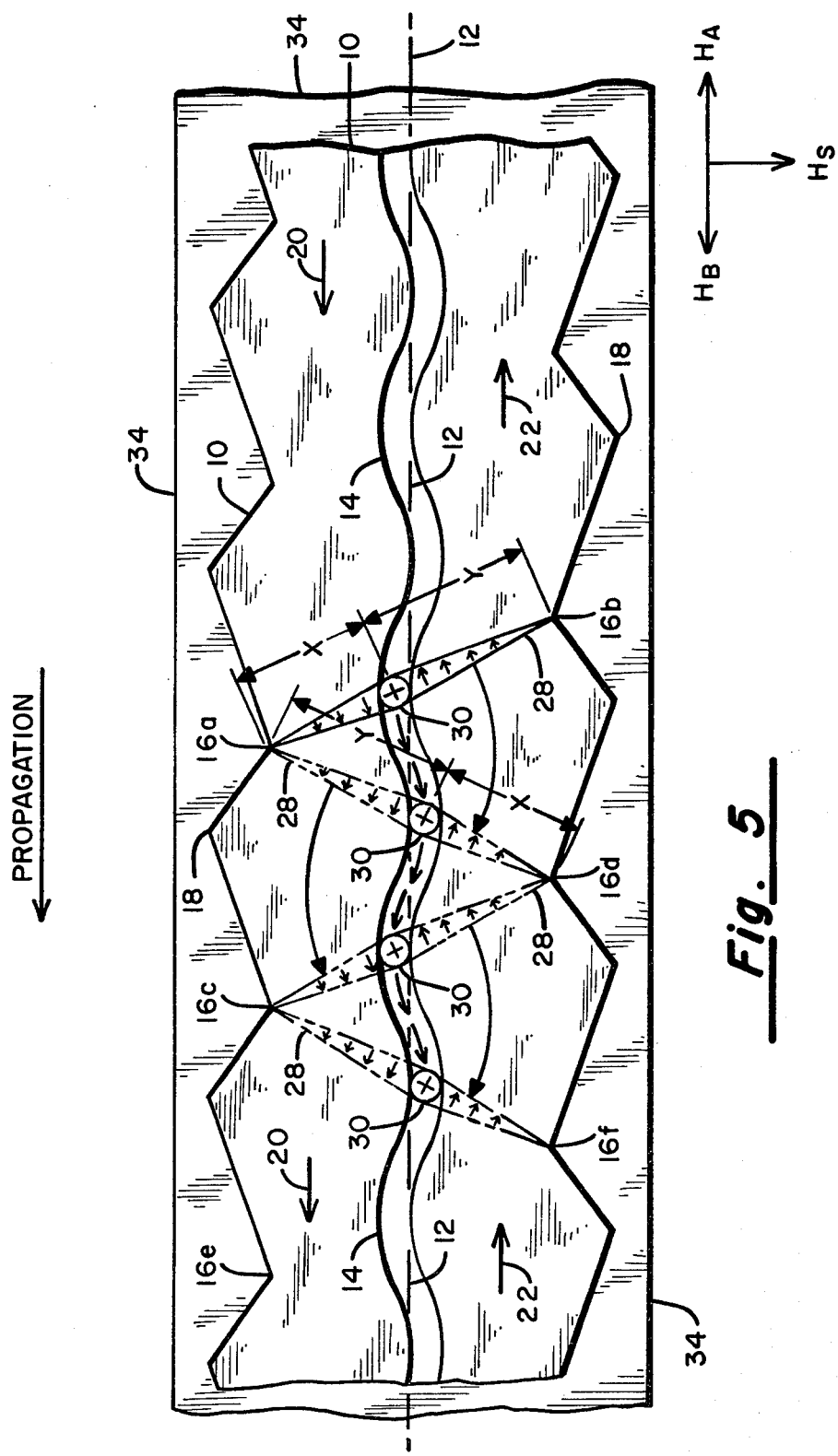
FIG. 5 is an illustration of the data track of FIG. 1 for the purpose of illustrating the rocking of the cross-ties and the unequal displacement of the cross-tie centers as the cross-tie, Bloch-line pairs are propagated along the data track when subjected to the appropriate drive fields of FIG. 4.

With particular reference to FIG. 5 there is presented an illustration of data track 10 for the pupose of better illustrating the rocking of the cross-ties 28 and the unequal displacement of the cross-tie centers 30 as the cross-tie, Bloch-line pairs are propagated along data track 10 when subjected to the appropriate drive fields of FIG. 4. In this illustration of the propagation of cross-tie 28, with the Bloch-line 26 omitted for clarity, it is shown that as the ends of cross-tie 28 are rocked from neck 16 to neck 16 along alternate edges of data track 10, e.g., from neck 16b to 16d, cross-tie center 30 is forced to follow the serpentine energy well 14 whereby the respective lengths of the two end portions of cross-tie 28 on opposite sides of the cross-tie center 30 are alternately lengthened, shortened, shortened, lengthened, etc. These two respective lengths are illustrated as having the lengths Y,X and X, Y wherein the respective lengths in a preferred embodiment were X:Y=7:9.

It has been shown in the hereinabove specification and drawings that there is provided therein an improved cross-tie wall memory system wherein memory capacity has been increased and drive field characteristics have been improved providing an improved magnetic memory system.

What is claimed is:

1. In a magnetic memory system in which binary data are stored as inverted Néel wall sections about the Bloch-lines of associated cross-tie, Bloch-line pairs, which cross-tie, Bloch-line pairs are generated in and are serially propagated downstream along a cross-tie wall in a magnetizable layer by appropriate drive fields, said magnetizable layer being configured into a data track forming strip whose two apposing edges are formed into mirror-imaged, uniformly spaced, repetitive patterns of asymmetrically shaped edges which repetitive patterns are formed of successive narrow portions, or necks, forming wide portions therebetween, and which edges are formed about the geometric centerline of the data track for establishing said cross-tie wall along said geometric line and structuring each of said cross-ties along said cross-tie wall and at opposite edge narrow portions of said data track and the associated Bloch-line at the next adjacent downstream opposite edge wide portions of said data track, the improving comprising:

forming a serpentine energy well along and about the geometric centerline of the data track, which energy well has the same period as the shaped edges;

displacing the necks of the opposing edges one half the distance between adjacent necks along each edge; and, propagating the cross-tie, Bloch-line pairs along the data track by rocking alternate ends of the cross-tie from its then associated neck to the next adjacent downstream neck.

2. In a magnetic memory system in which binary data are stored as the presence or absence of a cross-tie, which cross-tie is generated in and is serially propagated downstream along a cross-tie wall in a magentizable layer by appropriate drive fields, said magnetizable layer being configured into a data track forming strip whose two apposing edges are formed into mirror-imaged patterns of asymmetrically shaped edges which patterns are formed of successive narrow portions, or necks, for structuring each of said cross-ties along said cross-tie wall and across apposing pairs of said narrow portions, the improving comprising:

propagating the cross-tie along the data track by rocking each of alternate ends of the cross-tie from its then associated neck to the next adjacent downstream neck.

3. In a magnetic memory system in which binary data are stored as the presence or absence of a cross-tie, which cross-tie is generated in and is propagated in a magnetizable layer by appropriate drive fields, said magnetizable layer being configured into a data-track-forming-strip that has two apposing edge patterns that are formed into mirror-imaged, uniformly spaced, repetitive patterns of asymmetrically shaped edges which repetitive patterns are formed of successive narrow portion, or necks, for structuring said cross-tie along said cross-tie wall and across an apposing pair of said narrow portions, the improving comprising:

displacing said apposing edge patterns along said data track;

coupling drive fields to said cross-tie for varying the magnetic characteristics of said cross-tie; and, rocking alternate ends of said cross-tie across successive ones of the necks of said apposing edge patterns for propagating said cross-tie along said data track into and through successive apposing pairs of said necks.

* * * * *